(12) United States Patent
Lee et al.

(10) Patent No.: US 6,590,294 B1
(45) Date of Patent: Jul. 8, 2003

(54) DEVICE FOR BUMP PROBING AND METHOD OF FABRICATION

(75) Inventors: Cheng-Hong Lee, Shinjuang (TW); Hsin-Li Lee, Hsinchu (TW)

(73) Assignee: Industrial Technology Research Institute, Hsin Chu (TW)

( * ) Notice: Subject to any disclaimer, the term of this patent is extended or adjusted under 35 U.S.C. 154(b) by 0 days.

(21) Appl. No.: 10/075,939

(22) Filed: Feb. 13, 2002

(51) Int. Cl.[7] ............... H01L 23/48; H01L 23/52; H01L 29/40
(52) U.S. Cl. ............... 257/781; 257/780; 257/692; 438/614
(58) Field of Search ............... 257/780, 781, 257/784, 786, 758, 779, 692; 438/613, 614

(56) References Cited

U.S. PATENT DOCUMENTS

| | | | | |
|---|---|---|---|---|
| 5,962,918 A | * | 10/1999 | Kimura | |
| 5,962,921 A | * | 10/1999 | Farnworth et al. | |
| 6,028,366 A | * | 2/2000 | Abe | |
| 6,084,296 A | * | 7/2000 | Colello et al. | |
| 6,294,837 B1 | * | 9/2001 | Akram et al. | |
| 6,429,532 B1 | * | 8/2002 | Han et al. | |
| 6,437,451 B2 | * | 8/2002 | Farnworth et al. | |

* cited by examiner

Primary Examiner—Sheila V. Clark
(74) Attorney, Agent, or Firm—Tung & Associates

(57) ABSTRACT

A device for bump probing and a method for fabricating the device are described. The device utilizes a bimorph-structured fingers for holding onto a solder bump, or a solder ball, without causing damages to the ball. The device further utilizes a direct current to cause an electrostatic force to flatten the probe fingers prior to attaching the fingers to a solder ball and for positioning the finger over a solder ball. After the electrostatic force is removed by disconnecting the direct current from the electrodes, the fingers grip onto the solder ball making electrical connection and performing testing. The invention further provides a micro-electro-mechanical-system technique for fabricating the probing device on a semiconducting substrate.

20 Claims, 3 Drawing Sheets

DEVICE FOR BUMP PROBING AND METHOD OF FABRICATION

FIELD OF THE INVENTION

The present invention generally relates to a device for bump probing integrated circuit packages equipped with bumps and a method for fabricating the device. More particularly, the present invention relates to a device for bump probing an integrated circuit package and a method for fabricating the device.

BACKGROUND OF THE INVENTION

As semiconductor integrated circuits continue to be dramatically reduced in size, the trend in electronic manufacturing has been toward increasingly smaller geometries particularly in integrated circuit technology in which a very large number of discrete circuit elements are fabricated on a single substrate or "wafer". After fabrication, the wafer is divided into a number of rectangular-shaped chips or "dice" where each die presents a rectangular or other regular arrangement of metallized contact pads through which input/output connections are made. Although each die is eventually packaged separately, for efficiency sake, testing of the circuit formed on each die is preferably performed while the dies are still joined together on the wafer. One typical procedure is to support the wafer on a flat stage or "chuck" and to move the wafer in X, Y and Z directions relative to the head of the probing assembly so that the contacts on the probing assembly move from die to die for consecutive engagement with each die. Respective signal, power and ground lines are run to the probing assembly from the test instrumentation thus enabling each circuit to be sequentially connected to the test instrumentation.

One conventional type of probing assembly used for testing integrated circuits provides contacts that are configured as needle-like tips. These tips are mounted about a central opening formed in a probe card so as to radially converge inwardly and downwardly through the opening. When the wafer is raised beyond that point where the pads on the wafer first come into contact with these tips, the tips flex upwardly so as to skate forwardly across their respective pads thereby removing oxide buildup on the pads.

The problem with this type of probing assembly is that the needle-like tips, due to their narrow geometry, exhibit high inductance so that signal distortion is large in high frequency measurements made through these tips. Also, these tips can act in the manner of a planing tool as they wipe across their respective pads, thereby leading to excessive pad damage. This problem is magnified to the extent that the probe tips bend out of shape during use or otherwise fail to terminate in a common plane which causes the more forward ones of the tips to bear down too heavily on their respective pads.

Thus, in the course of testing semiconductor devices and circuits it becomes necessary to contact and electrically probe the devices and circuits to ascertain their function and determine failure mechanisms. To accomplish this, a finely pointed probe tip or group of finely pointed probe tips is brought into contact with the device or circuit by using pads connected to the device or circuit. As semiconductor devices become smaller and circuits denser, it becomes difficult to make electrical contact with the device with conventional probes, as the probe tips are either too large or too blunt to selectively contact only the intended device or circuit because they have a propensity to contact adjacent structures. Or, the tips are so thin as to bend when contact is attempted and slide off the probe terminal target circuit being tested. When multiple probes are required, it is often not possible to bring the correct number of probe tips close enough to each other because the size of the bodies will physically interfere with one another or will block the view of the target area being tested, thereby making alignment difficult or impossible.

As a result of these problems, pads on semiconductor devices which can number several hundred are often limited by the probe assemblies or probe rings used because of the size of the probe tips. This is especially true in the street or kerf regions between active dies on semiconductor wafers, wherein special test and process monitoring devices and circuits are often fabricated. The actual devices and monitoring structures are often very much smaller than the pads connected to them. A more compact probe assembly would allow smaller pads to be used allowing more devices in the same space or the same number of devices in a smaller space.

The present inventors thus recognize based on the foregoing, that a need exists for an acceptable micro tip that can be utilized with micro probes as semiconductor circuits continue to shrink. Users typically waste a great deal of time and effort attempting to fabricate an acceptable micro tip. To date, a reliable method for fabricating an acceptable micro tip has not been evidenced. The present inventors believe that implementing a micro tip in accordance with the invention described herein can thus solve these problems.

It is therefore an object of the present invention to provide a device for bump probing that does not have the drawbacks and shortcomings of the conventional devices.

It is another object of the present invention to provide a device for bump probing that can be fabricated by a micro-electro-mechanical system (MEMS) technique.

It is a further object of the present invention to provide a device for bump probing wherein the device can be controlled by an electrostatic force.

It is another further object of the present invention to provide a device for bump probing wherein the device can be controlled by a direct current flown to electrodes in the device.

It is still another object of the present invention to provide a method for fabricating a device for bump probing which can be carried out on a semiconducting substrate.

SUMMARY OF THE INVENTION

In accordance with the present invention, a method for fabricating a device for bump probing and the device fabricated are provided.

In a preferred embodiment, a method for fabricating a device for bump probing can be carried out by the operating steps of providing a semiconducting substrate; forming a first insulating material layer on the semiconducting substrate; depositing a first metal layer with a first metal and forming spaced-apart a first and a second electrode; depositing a second insulating material layer on top of the semiconducting substrate embedding the first and second electrodes; forming a via hole through the insulating material layer exposing a tip portion of the second electrode; depositing a second metal layer on top of the second insulating material layer and filling the via hole with a second metal forming an electrode support; depositing a third metal layer on top of the second metal layer; patterning the third metal layer into at least four finger tips; patterning the second metal layer into at least four fingers for supporting the at least four finger tips, the at least four fingers are in electrical communication with the electrode support and overhang the first electrode; and etching away the second insulating material layer to release the at least four fingers such that the at least four finger tips curve upwardly.

The method for fabricating a device for bump probing may further including the step of flowing a direct current of positive polarity to the first electrode and a direct current of negative polarity to the second electrode, or the step of flowing a direct current to the first and second electrodes such that an electrostatic force is generated to pull the at least four finger tips downwardly to a horizontal plane. The method may further include the step of depositing the first and the second insulating material layers from a material selected from the group consisting of silicon oxide, silicon nitride and silicon oxynitride. The method may further include the step of depositing the first metal layer with a first metal selected from the group consisting of Cu, Al and CuAl alloys, or the step of depositing the second metal layer with a second metal selected from the group consisting of Cu, Au and Ni, or the step of depositing the third metal layer with a third metal selected from the group consisting of Cr and Ni, wherein the third metal is different than the second metal. The method may further include the step of depositing the second and third metal layers to a thickness between about 0.1 $\mu$m and about 2 $\mu$m, or the step of etching away the second insulating material layer by a wet etching method, or the step of forming the at least four finger tips in a cone shape.

The present invention is further directed to a device for bump probing that includes a semiconducting substrate; an insulating material layer on top of the semiconducting substrate; a first electrode and a second electrode formed spaced-apart on the insulating material layer, the second electrode being formed in a ring shape surrounding a tip portion of the first electrode; an electrode support formed on top of and electrical communication with the tip portion of the first electrode; at least four fingers formed emanating outwardly from the electrode support in a spaced-apart relationship, the at least four fingers are formed of an electrically conductive metal; and at least four finger tips each formed integral with and in electrical communication with one of the at least four fingers extending upwardly from the finger.

In the device for bump probing, the insulating material layer may be formed of a material selected from the group consisting of silicon oxide, silicon nitride and silicon oxynitride. The first electrode and the second electrode may be formed of a metal selected from the group consisting of Cu, Al and CuAl. The at least four fingers may be formed emanating from a tip of the electrode support such that the fingers are spaced-apart from the electrodes by a distance of at least 1 mm. The at least four fingers each has a thickness of between about 0.1 $\mu$m and about 2 $\mu$m, and the at least four finger tips each has a thickness of between about 0.1 $\mu$m and about 2 $\mu$m. The at least four finger tips may be formed in a cone-shape for gripping a bump. The device may further include means for generating a direct current for feeding to the first and the second electrode, or means for generating a positive current for flowing to the first electrode and a negative current for flowing to the second electrode. The at least four fingers may be formed with a tip of each finger in a curved-up position for ease of electrically contacting a bump.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a device for bump probing an IC package equipped with bumps and a method for fabricating the device.

The device can be fabricated by a micro-electro-mechanical system (MEMS) technique into a probe card and, can be used for testing solder bumps (or other bumps) on an IC device. The present invention novel testing device provides the benefits that first, it does not damage the bumps during testing and secondly, it ensures good electrical contact between each probe and each bump.

The present invention novel device is fabricated by utilizing a sacrificial, insulating material layer to release electrically conductive metal fingers formed on top. The device further utilizes a dual-metal construction, i.e. or a bimorph construction, to provide a finger tip, or a microprobe that curves upwardly. The microprobe that curves upwardly can be operated and controlled by an electrostatic force by using a direct current between two electrodes. For instance, when the probe card is used to approach an IC device, a direct current is applied to the probe card such that the electrostatic force pulls back the microprobes to a horizontal position to facilitate the positioning of the probe card, i.e. and thus the microprobes on the bumps. A further benefit made possible by the present invention novel device is that the curved microprobes allow a height differential among the solder bumps, or the solder balls. A small difference in the bump height can be tolerated by the present invention novel probe cards.

Figure 1:
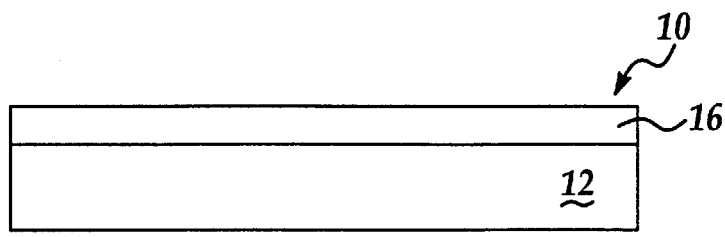
FIG. 1 is an enlarged, cross-sectional view of a present invention device as represented by a semiconducting substrate with an insulating material layer coated on top.

Referring initially to FIG. 1, wherein an enlarged, cross-sectional view of the present invention device 10 as represented by a semiconducting substrate 12 and an insulating material layer 16 coated on top is shown. The semiconducting substrate 12 may be advantageously a silicon substrate or a substrate formed of other suitable semiconducting material. The insulating material layer 16 may be suitably formed of silicon oxide, silicon nitride or silicon oxynitride to a thickness of at least 0.5 μm.

Figure 2:
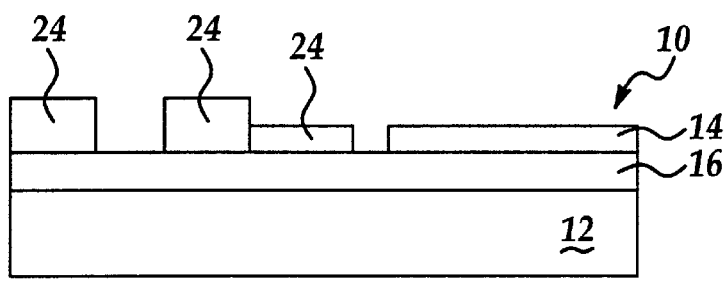
FIG. 2 is an enlarged, cross-sectional view of the present invention device of FIG. 1 with an electrically conductive electrode layer deposited on top and patterned.
Figure 3:
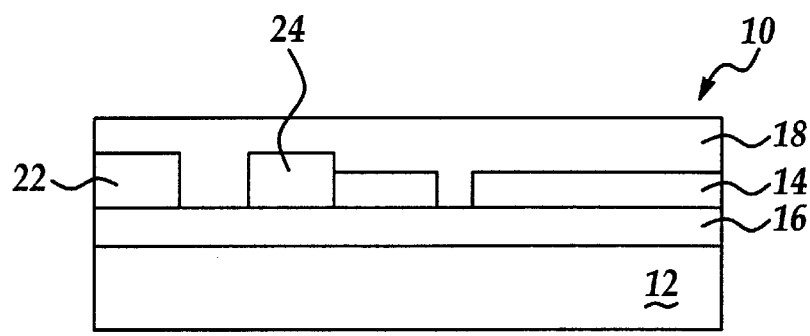
FIG. 3 is an enlarged, cross-sectional view of the present invention device of FIG. 2 with a sacrificial, insulating material layer deposited on top.
Figure 4:
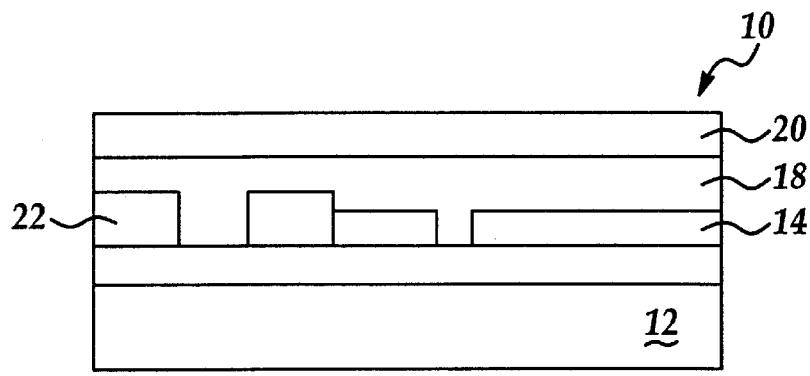
FIG. 4 is an enlarged, cross-sectional view of the present invention device of FIG. 3 with a first metal layer deposited on top.

On top of the insulating material layer 16, as shown in FIG. 2, is then deposited an electrode layer 14 and patterned into electrodes 22,24. The electrode material may be deposited of a material such as Cu, Al or CuAl alloys. On top of the electrodes 22,24, is then deposited a sacrificial, insulating material layer 18 by a suitable insulating material such as silicon oxide or silicon nitride. A suitable thickness of the sacrificial, insulating material layer 18 is at least 0.5 μm and may be as thick as 2 μm. A first metal layer 20 is then deposited on top of the sacrificial, insulating material layer 18, as shown in FIG. 4. The second metal layer 20 may be formed of a metal selected from the group consisting of Cu, Al or Ni. The thickness of the second metal layer 20 may be suitably between about 0.1 μm and about 2 μm.

Figure 5:
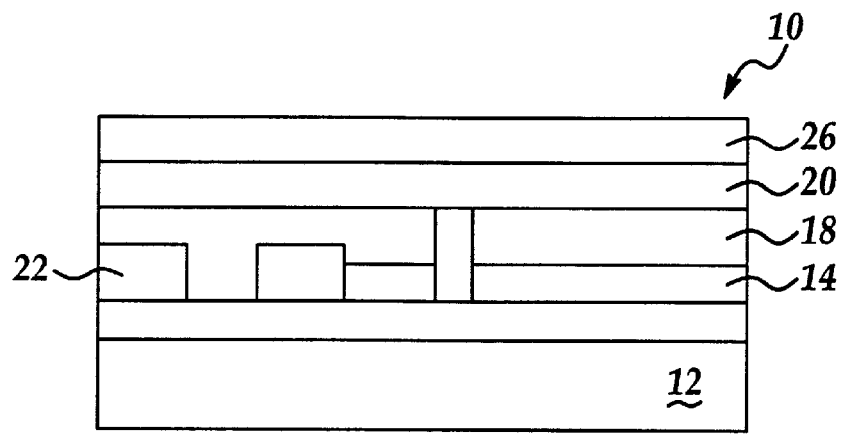
FIG. 5 is an enlarged, cross-sectional view of the present invention device of FIG. 4 with a second metal layer deposited on top.
Figure 6:
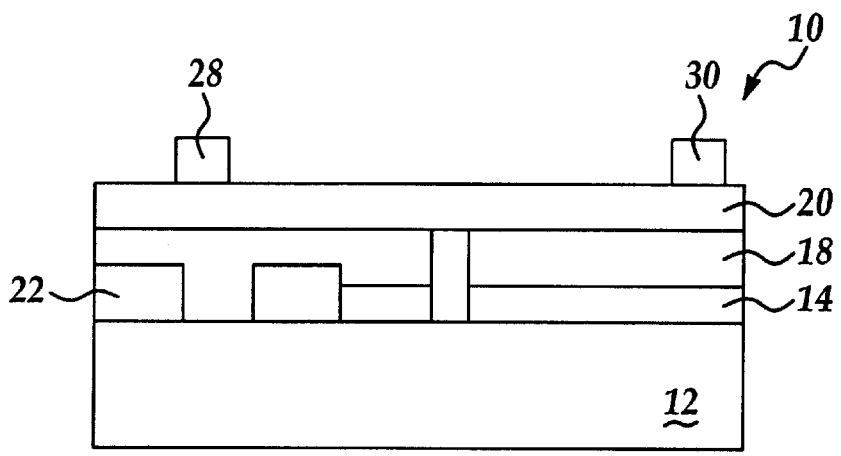
FIG. 6 is an enlarged, cross-sectional view of the present invention device of FIG. 5 with the second metal layer patterned into finger tips.

In the next step of the process, as shown in FIG. 5, a third metal layer 26 is deposited on top of the second metal layer 20. The third metal layer 26 should be deposited of a metal that is different than that in the second metal layer 20. For instance, a suitable material for the third metal layer 26 may be Cr or Ni. A suitable technique for depositing the third metal layer 26 and the second metal layer 20 may be a sputtering technique. A suitable thickness for the third metal layer 26 may be between about 0.1 μm and about 2 μm.

Figure 10:
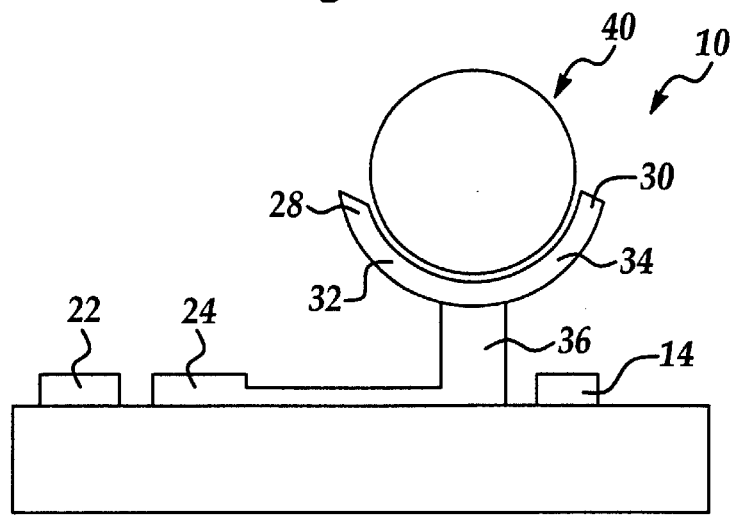
FIG. 10 is a side view of the present invention device with the fingers engaging a solder ball.

The present invention novel device of a probe card can then be formed by first patterning and etching away the third metal layer 26 and forming finger tips 28,30 on top of the first metal layer 20. The finger tips 28,30 are formed for gripping onto a solder bump or a solder ball, which is shown in FIG. 10. The etching process for forming the finger tips 28,30 may be suitably carried out by a dry etch technique such as reactive ion etching.

Figure 7:
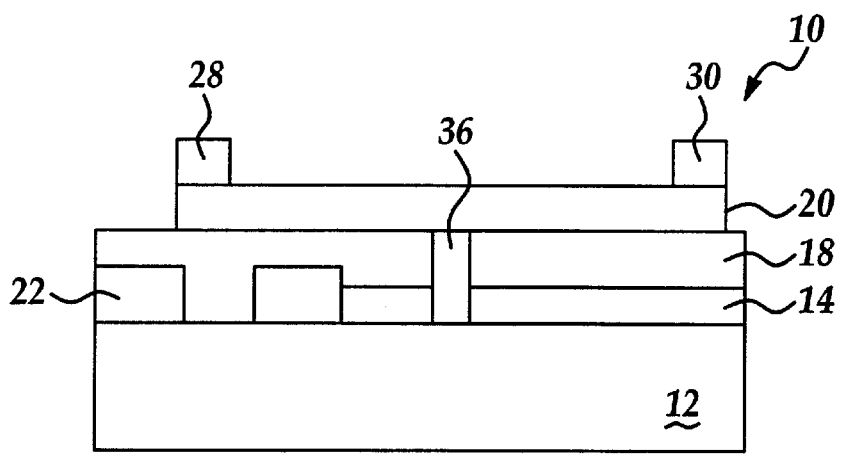
FIG. 7 is an enlarged, cross-sectional view of the present invention device of FIG. 6 with the first metal layer patterned into two opposite fingers.

After the formation of the finger tips 28,30, the second metal layer 20 is patterned and formed, as shown in FIG. 7 into two opposite fingers 32,34. The two oppositely positioned fingers 32,34 are electrically connected to the electrode support 36 for making electrical contact with the test apparatus. The process for forming the fingers 32,34 may be carried out by a dry etch technique such as reactive ion etching.

Figure 8:
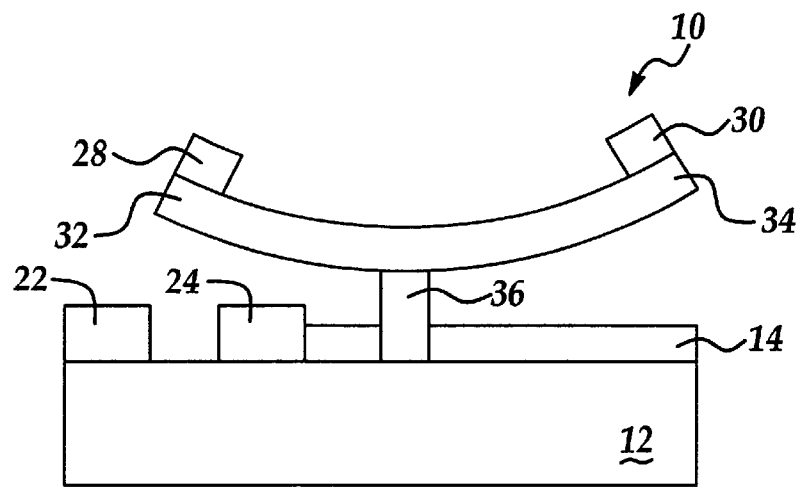
FIG. 8 is an enlarged, cross-sectional view of the present invention device of FIG. 7 with the sacrificial, insulating material layer removed allowing the finger tips to curve up.

The present invention device 10 is then wet etched to remove the sacrificial, insulating material layer 18 and thus, releasing the fingers 32 and 34. Due to the bimorph structure, with different metals used in the finger tips 28,30 and the fingers 32,34, the tip portions of the fingers 32,34 curve upwardly as shown in FIG. 8. The different coefficients of thermal expansion between the two different metallic materials used in forming the finger tips 28,30 and the fingers 32,34 contribute to the curving phenomenon observed in FIG. 8.

Figure 9:
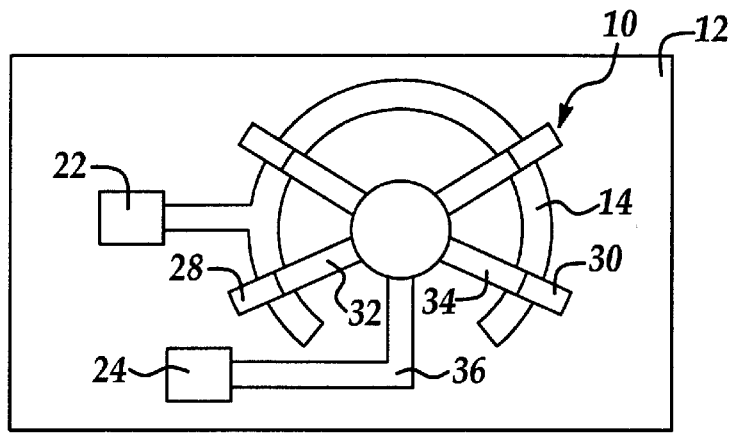
FIG. 9 is a plane view of the present invention device of FIG. 8.

FIG. 9 illustrates a plane view of the present invention device 10. The layout of the electrodes 22,24 are better illustrated in the plane view. The electrodes 22,24 are each connected to a positive polarity and a negative polarity of a direct current generated by a current source (not shown) such that the circular-shaped electrode 14 and the fingers 32,34 are charged with opposite charges and creates an electrostatic attraction between the fingers and the electrodes. As a result, the fingers 32,34 are pulled back toward the semiconducting substrate 12 to be in a horizontal plane, opposite to that shown in FIG. 8.

After the present invention device 10 is positioned juxtaposed to an IC device that has solder balls 40 exposed, as shown in FIG. 10, the electrode 22 is grounded, i.e. or disconnected from the current source, to enable the fingers 32,34 to curve upwardly and making intimate contact with the solder balls 40. Test signals transmitted through the solder balls 40 can thus be transmitted to the testing apparatus through electrode support 36 and electrode 24. The present invention novel device therefore utilizes electrostatic attraction forces generated by a direct current to enable test fingers to grip onto a solder ball without causing damage to the ball. The curved fingers further allow a large tolerance in the height of the solder ball 40 and thus, are more forgiving in testing solder balls formed at different heights on an IC package.

The present invention novel device and method for bump probing, or solder ball probing, have therefore been amply described in the above description and in the appended drawings of FIGS. 1–10.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. A method for fabricating a device for bump probing comprising the steps of:

providing a semiconducting substrate;

forming a first insulating material layer on said semiconducting substrate;

depositing a first metal layer with a first metal and forming spaced-apart a first and a second electrode;

depositing a second insulating material layer on top of said semiconducting substrate embedding said two spaced-apart electrodes;

forming a via hole through said insulating material layer exposing a tip portion of said second electrode;

depositing a second metal layer on top of said second insulating material layer and filling said via hole with a second metal forming an electrode support;

depositing a third metal layer on top of said second metal layer;

patterning said third metal layer into at least four finger tips;

patterning said second metal layer into at least four fingers for supporting said at least four finger tips, said at least four fingers are in electrical communication with said electrode support and overhang said first electrode; and etching away said second insulating material layer to release said at least four fingers such that said at least four finger tips curve upwardly.

2. A method for fabricating a device for bump probing according to claim 1 further comprising the step of flowing a direct current of positive polarity to said first electrode and a direct current of negative polarity to said second electrode.

3. A method for fabricating a device for bump probing according to claim 1 further comprising the step of flowing a direct current to said first and second electrodes such that an electrostatic force is generated to pull said at least four finger tips downwardly to a horizontal plane.

4. A method for fabricating a device for bump probing according to claim 1 further comprising the step of depositing said first and said second insulating material layers from a material selected from the group consisting of silicon oxide, silicon nitride and silicon oxynitride.

5. A method for fabricating a device for bump probing according to claim 1 further comprising the step of depositing said first metal layer with a first metal selected from the group consisting of Cu, Al and CuAl.

6. A method for fabricating a device for bump probing according to claim 1 further comprising the step of depositing said second metal layer with a second metal selected from the group consisting of Cu, Au and Ni.

7. A method for fabricating a device for bump probing according to claim 1 further comprising the step of depositing said third metal layer with a third metal selected from the group consisting of Cr and Ni, wherein said third metal being different than said second metal.

8. A method for fabricating a device for bump probing according to claim 1 further comprising the step of depositing said second and third metal layers to a thickness between about 0.1 $\mu$m and about 2 $\mu$m.

9. A method for fabricating a device for bump probing according to claim 1 further comprising the step of etching away said second insulating material layer by a wet etching method.

10. A method for fabricating a device for bump probing according to claim 1 further comprising the step of forming said at least four finger tips in a cone shape.

11. A device for bump probing comprising:

a semiconducting substrate;

an insulating material layer on top of said semiconducting substrate;

a first electrode and a second electrode formed spaced-apart on said insulating material layer, said second electrode being formed in a ring shape surrounding a tip portion of said first electrode;

at least four fingers formed emanating outwardly from said electrode support in a spaced-apart relationship, said at least four fingers being formed of an electrically conductive metal; and at least four finger tips each formed integral with and in electrical communication with one of said at least four fingers extending upwardly from said finger.

12. A device for bump probing according to claim 11, wherein said insulating material layer being formed of a material selected from the group consisting of silicon oxide, silicon nitride and silicon oxynitride.

13. A device for bump probing according to claim 11, wherein said first electrode and said second electrode are formed of a metal selected from the group consisting of Cu, Al and CuAl.

14. A device for bump probing according to claim 11, wherein said at least four fingers are formed emanating from a tip of said electrode support such that the fingers are spaced-apart from said electrodes by a distance of at least 1 mm.

15. A device for bump probing according to claim 11, wherein said at least four fingers each having a thickness of between about 0.1 $\mu$m and about 2 $\mu$m.

16. A device for bump probing according to claim 11, wherein said at least four finger tips each having a thickness of between about 0.1 $\mu$m and about 2 $\mu$m.

17. A device for bump probing according to claim 11, wherein said at least four finger tips are formed in a cone-shape for gripping a bump.

18. A device for bump probing according to claim 11 further comprising means for generating a direct current for feeding to said first and said second electrode.

19. A device for bump probing according to claim 11 further comprising means for generating a positive current for flowing to said first electrode and a negative current for flowing to said second electrode.

20. A device for bump probing according to claim 11, wherein said at least four fingers are formed with a tip of each finger in a curved-up position for ease of electrically contacting a bump.

* * * * *